(12) United States Patent
Sopori

(10) Patent No.: US 6,852,371 B2
(45) Date of Patent: Feb. 8, 2005

(54) METAL PROCESSING FOR IMPURITY GETTERING IN SILICON

(75) Inventor: Bhushan L. Sopori, Denver, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/220,668

(22) PCT Filed: Mar. 2, 2001

(86) PCT No.: PCT/US01/06692
§ 371 (c)(1),
(2), (4) Date: Aug. 30, 2002

(87) PCT Pub. No.: WO01/67503
PCT Pub. Date: Sep. 13, 2001

(65) Prior Publication Data
US 2003/0207044 A1 Nov. 6, 2003

Related U.S. Application Data
(60) Provisional application No. 60/186,735, filed on Mar. 3, 2000.

(51) Int. Cl.$^7$ .............................. B05D 3/06; H01L 21/33; H01L 21/324; H01L 21/385; H01L 21/42
(52) U.S. Cl. ...................... 427/557; 427/559; 427/553; 438/473; 438/476
(58) Field of Search .................... 427/553, 554, 427/555, 556, 557, 558, 559; 438/473, 476

(56) References Cited

U.S. PATENT DOCUMENTS

| | | | | |
|---|---|---|---|---|
| 4,311,870 A | * | 1/1982 | Frosch et al. | 136/261 |
| 4,994,399 A | * | 2/1991 | Aoki | 438/473 |
| 5,223,453 A | * | 6/1993 | Sopori | 437/173 |
| 5,304,509 A | * | 4/1994 | Sopori | 437/173 |
| 5,426,061 A | * | 6/1995 | Sopori | 437/11 |
| 5,627,081 A | * | 5/1997 | Tsuo et al. | 438/473 |
| 5,897,331 A | | 4/1999 | Sopori | |
| 6,043,137 A | * | 3/2000 | Krueger et al. | 438/471 |
| 6,201,261 B1 | * | 3/2001 | Sopori | 257/72 |
| 6,228,748 B1 | * | 5/2001 | Anderson et al. | 438/476 |
| 6,465,288 B1 | * | 10/2002 | Ohnuma | 438/166 |
| 2002/0106841 A1 | * | 8/2002 | Yamazaki | 438/149 |
| 2004/0102056 A1 | * | 5/2004 | Tobe et al. | 438/795 |
| 2004/0115906 A1 | * | 6/2004 | Makita et al. | 438/486 |

FOREIGN PATENT DOCUMENTS

| | | |
|---|---|---|
| JP | 59 087877 A | 5/1984 |
| JP | 63 108729 A | 5/1988 |

OTHER PUBLICATIONS

Translation to JP 59–087877 to Ishikawa et al.*
JPO & Derwent abstracts to JP 359087877A (JP 59–87877) to Toshiba Corp, Ishikawa et al, May 21, 1984.*
JPO & Derwent English abstracts to JP363108729A (63–108729) to Nec Corp, Yamamoto et al, May 13, 1988.*
Translation to Yamamoto et al (JP 63–108729), May 13, 1988.*
Henquinet, N.G., et al., "Limiting Factors of Backside External Gettering by Nanocavities And Aluminum–Silicon Alloying in Silicon Wafers," proceedings of the Materials Research Society Symposium, 1998, pp. 221–226, vol. 510, France, no month.

* cited by examiner

Primary Examiner—Marianne Padgett
(74) Attorney, Agent, or Firm—Paul J. White (57) ABSTRACT

A method is provided for gettering impurities from silicon wafers and devices to improve the quality of the material and the device performance. The wafer or the device is coated on the back-side with a layer of aluminum and is illuminated form the other side with light having a significant portion of energy in the IR region. This process leads to formation of a Si—Al melt on the backside, at temperature below 550° C. Dissolved impurities in the Si diffuse toward the Al melt and are trapped there. At higher illuminations and concomitant higher temperatures, the Al interface serves as a source of point defect injection. This mode of processing causes dissolution of precipitated impurities at greatly reduced temperatures and in short periods of time.

14 Claims, 5 Drawing Sheets

METAL PROCESSING FOR IMPURITY GETTERING IN SILICON

This application claims benefit of provisional application 60/186,735 filed Mar. 3, 2000.

BACKGROUND ART

The performance of semiconductor devices can be affected significantly by impurities present in the semiconductor materials. For example, in MOS devices, the leakage current is controlled primarily by impurity segregation/precipitation at the Si-oxide interface. In most microelectronic silicon devices, the quality of the as-grown material is quite high. Yet, when the device is fabricated, it can have a much higher concentration of impurities because of impurity in-diffusion during the device fabrication—from cleaning procedures, furnaces used for various processes, such as oxidation, contact formation, etc. In view of these problems, semiconductor device fabrication techniques include (as an insurance policy) processes that can remove impurities from the device. The removal of impurities from an active region of a device to a benign region is referred to as "impurity gettering". Most microelectronic devices use only the surface region of a wafer. Therefore, impurities can be gettered from the surface region to materials located deeper inside of the wafer, i.e., farther away from the surface region, where they can reside without interfering with the operation of the device. This approach, called "internal gettering," takes advantage of high concentrations of oxygen in a Czochralksi wafer. The oxygen is made to precipitate within the thickness of a wafer trapping impurities with them. These impurities are drawn from the surface of the wafer to produce a denuded zone at the surface of the wafer. Because, the microelectronic devices are typically surface devices, such a gettering technique is well-suited for microelectronics.

Impurity gettering is also extremely important for Si solar cells. However, in Si solar cells, the gettering is used to improve the quality of the as-grown material. The photovoltaic silicon (PV—Si) industry uses both single- and multi-crystalline (mc) wafers that are grown by techniques specially developed to produce low-cost material. Typically, the single crystal ingots are grown by a Czochralski (CZ)-type process, and mc-Si is either cast or in the ribbon form. Because the substrate cost must be kept low, the PV industry employs a host of cost-cutting measures that include low-quality poly feedstock, a lower degree of cleanliness and control in the crystal growth process, and a high crystal-growth rate. These cost-cutting measures can, and often do, compromise the crystallinity, as well as the chemical purity of the material. Concomitantly, PV-Si often has high concentrations of impurities and defects.

PV-Si manufacturers often use low-grade feedstock, such as pot-scrap, off-spec, and remelt silicon—much of which is rejected material from the microelectronic industry and contains impurities. The impurities present in the feedstock remain when the feedstock is melted, and they get carried with the melt into the crystalline ingots grown from the melt, as dictated by the segregation coefficients. Hence, in general, the PV starting material, i.e., the crystalline or multicrystalline Si ingots, will have high impurity content. Therefore, substrate wafers cut from such Si ingots will also have that high impurity content. Typically these substrates contain C and/or O in near-saturation levels, as well as transition metals in the range of $10^{12}$–$10^{14}$ cm$^{-3}$. Because of their high concentrations, in many cases impurities can and do precipitate at preferred sites, such as at extended defects, grain boundaries, and defect clusters. The chemical structure of such precipitates can be quite complex. For example, micro-X-ray analyses have shown that some precipitates are predominantly metallic but have significant amounts of oxygen and/or carbon associated with them. This may indicate that metal precipitates are silicides, carbides, and oxides. On the other hand, this may mean that metal precipitation is a secondary process that takes place in the proximity of pre-existing oxygen/carbon precipitates. Such a phenomenon may occur as a local stress relaxation mechanism.

The single-crystal CZ ingots for PV are pulled at growth rates that can be many times faster than that of the conventional growth for microelectronics. The fast cooling rates used in pulling CZ ingots are accompanied by excessive thermal stresses that lead to generation of defects in the crystalline structure. Consequently, the single crystal material is expected to have high concentrations of quenched-in, non-equilibrium, point defects. In some cases, a portion of the ingot may acquire a high density of crystal defects (primarily dislocations) and even lose the crystallinity and become multicrystalline (mc). Such mc-Si substrates typically have very large grains with small grain boundary areas that produce only small effects on the device performance. The dominant intragrain defect is dislocation. High-quality mc-Si substrates have a tendency to form clusters of defects. The average defect density is about $10^5$ cm$^{-2}$; however, there can be localized clusters of defects where the defect density can exceed $10^7$ cm$^{-2}$. Our previous work has shown that such defects include networks of dislocations, stacking faults, and grain boundaries. Detailed analyses have shown that such defect clusters are also sites of impurity precipitates. It is rather interesting and a matter of curiosity that impurity precipitation occurs at defect clusters rather than at grain boundaries or at other isolated defects.

Gettering for Solar Cells

It is well-known that the performance of solar cells would be quite poor if the devices had as high concentrations of impurities as in the as-grown PV-Si. Fortunately, some of the impurities are removed during the device processing. Solar cells, being minority-carrier devices, use nearly the entire bulk of the device. Hence, the internal gettering technique is not suitable for solar cells. It is more attractive to apply external gettering techniques to clean up the bulk of the material. In the external gettering processes, the impurities are drawn to the surface and trapped. Phosphorous diffusion and Al alloying are some of the processes that have worked well for efficient gettering of solar cells.

In Al gettering, the goal is to draw impurities from the Si crystal structure into the Al and trap them there, so they cannot migrate or diffuse back into the Si crystal. Typically, a thin layer of Al (about 1 $\mu$m) is deposited onto a surface of the Si wafer or a partially completed device comprising a Si wafer. The Si wafer or device is then heated to about 800 to 850° C. for 30–60 minutes. The Al is liquid in this temperature range. Most metallic impurities in the Si crystal material, particularly those that are responsible for degrading minority carrier lifetime, are highly soluble in the liquid Al. Therefore, it is believed that, during this thermal process, impurities in the Si crystal material diffuse toward the liquid Al, where they are dissolved in the Al layer. Upon cooling and resulting solidification of the Al, the impurities are expected to remain trapped in the solid Al or in a Si—Al alloy region that may be formed at the Si—Al interface during this thermal process. The result is that the bulk of the Si wafer is left with a greatly reduced impurity concentration, which increases the solar cell performance, primarily due to improvement in minority carrier diffusion length in the regions from which the impurities were removed during this gettering process.

Because these processes are used extensively in solar cell manufacturing, all Si solar cells experience a certain degree of gettering. However, it is often necessary to optimize each of these process steps such that the highest degree of gettering is attained without sacrificing the junction or the contact properties. For example, in solar cell fabrication, impurity gettering by Al occurs as a by-product during formation of back surface field. However, because high temperatures are involved in this process step, it should be used prior to low temperature process steps, such as formation of the electric contacts on the device. Consequently, Al gettering, when used as described above, is not particularly effective against impurities that diffuse into the Si in subsequent process steps, which will remain in the silicon material and adversely affect the device performance. It is also likely that the impurities gettered into the Al region can be detrapped during subsequent processing. Therefore, a preferred mode of gettering is to apply it as the last process step in fabricating a device in order to ensure removal of impurities present in the "as-grown" substrate as well as those that diffuse into the substrate during the device fabrication steps. However, the conventional gettering procedure described above is, unfortunately, not compatible with a finished device.

Furthermore, Al treatment at high temperatures (>500° C.) produces an interface that absorbs light strongly. The presence of such an absorbing interface in a solar cell is accompanied by a loss in the cell efficiency, because light that reaches such an interface will not be reflected back to the active semiconductor region where it can be absorbed and converted to electric energy.

The high temperatures and/or long processing times, i.e., large time×temperature product, are required in the state-of-the-art (prior to this invention) Al gettering, as currently used in solar cell fabrication processing, because of the slow diffusivity of impurities dissolved in the Si substrate. The slower the diffusivity of the impurities, the longer times and/or higher temperatures will be required for such impurities to diffuse through the Si substrate to the Al, where they can be trapped as described above.

However, diffusivity of impurities dissolved in the Si substrate is not the only problem that drives up time× temperature product. As explained above, many impurities precipitate at the defect clusters. To getter such precipitated impurities, the precipitates must be dissolved before the impurities can become mobile and diffuse through the Si. Unfortunately, impurity dissolution is a very slow process at reasonable process temperatures. Such a dissolution depends on the temperature as well as the precipitate size.

For example, calculations show that, for the Al gettering process at 800° C., it will take more than 7 hours to reduce the total Fe concentration by three orders. For larger precipitates, still longer gettering times are needed; e.g., for the precipitate size of 50 nm, it will take many days at 800° C. to notice any gettering effect. We expect that a similar situation holds also for Cr, but only more difficult, because of its lower (one order of magnitude) diffusivity value.

These discussions clearly show that gettering of defect clusters (that have precipitated impurities) can be very difficult, and that conventional processing techniques cannot dissolve the impurities within such defect regions. It is important to note that, while effective gettering can be achieved throughout most of the substrate material by such conventional processing steps, the local regions of defect clusters in the substrate material remain effectively unchanged. Therefore, even in conventional processes that are designed to achieve a significant reduction in the dissolved impurity concentrations in the Si substrate, thus some—even significant—improvement in device performance, the over-all improvement potential is curtailed considerably by a lack of gettering in the defected regions of the substrate. In a large-area device, the local regions of high recombination that occur at such defect clusters can lead to "shunts" that can severely degrade the voltage-related device parameters. Therefore, such regions can strongly limit the device performance. Unfortunately, dissolution of such impurities requires high temperatures and cool-down cycles that are not compatible with conventional semiconductor processing.

Al gettering is a very valuable method that allows commercial fabrication of high efficiency solar cells on low-cost silicon substrates. Experimentally, the Al alloying is done at 800–850° C. for about 30 minutes. This technique works reasonably well, but it has many disadvantages, such as:

(i) high time and temperature process;
(ii) back interface becomes nearly non-reflecting;
(iii) often the front contact and back contact formation requires separate processing; and
(iv) improvements in cell performance and efficiency are still curtailed by defect clusters in which impurities are precipitated and which can lead to shunts, especially in large-area devices, that can strongly limit device performance.

DISCLOSURE OF INVENTION

Accordingly, it is a general object of this invention to increase efficiency and performance of solar cell devices fabricated with crystalline or multicrystalline substrates.

A more specific object of the present invention is to lower process times and/or temperatures for gettering impurities from crystalline or multicrystalline substrates of solar cell devices.

Another specific object of this invention is to dissolve precipitate impurities in crystalline or multicrystalline substrates to enable more effective gettering of such impurities.

Yet another object of this invention is to enable gettering after or during construction of metal contacts to avoid subsequent processing steps after gettering that can reintroduce contaminants into the substrate after gettering.

Another object of the invention is to enhance diffusivity of impurities in bulk silicon wafers or substrates to improve gettering results.

Another object of the invention is to provide an impurity gettering process that can be performed at temperatures below 800° C. and with simultaneous use of Al for a gettering medium as well as for optical excitation and such that the Al can function effectively as an electric contact for the device after gettering.

Another object of the invention is to provide a gettering process for use on finished semiconductor devices having front and back Al contacts.

Another object of the invention is to provide effective gettering for electronic devices by raising wafer temperature for a short time duration, e.g, less than about ten (10) minutes.

These and other objects, advantages, and novel features of the invention are set forth in part in the description that follows and will become apparent to those skilled in the art upon examination of the following description and figures or may be learned by practicing the invention.

BRIEF DESCRIPTION OF DRAWINGS

The accompanying drawings, which are incorporated in and form a part of the specification, illustrate the preferred embodiments of the present invention, and together with the descriptions serve to explain the principles of the invention.

In the Drawings:

FIGS. 5(a) and (b) is a topographic function map illustrating a sample mc-Si wafer and showing minority carrier diffusion length distribution before (a) and after (b) gettering using point defect injection according to this invention.

BEST MODE FOR CARRYING OUT THE INVENTION

Figure 1:
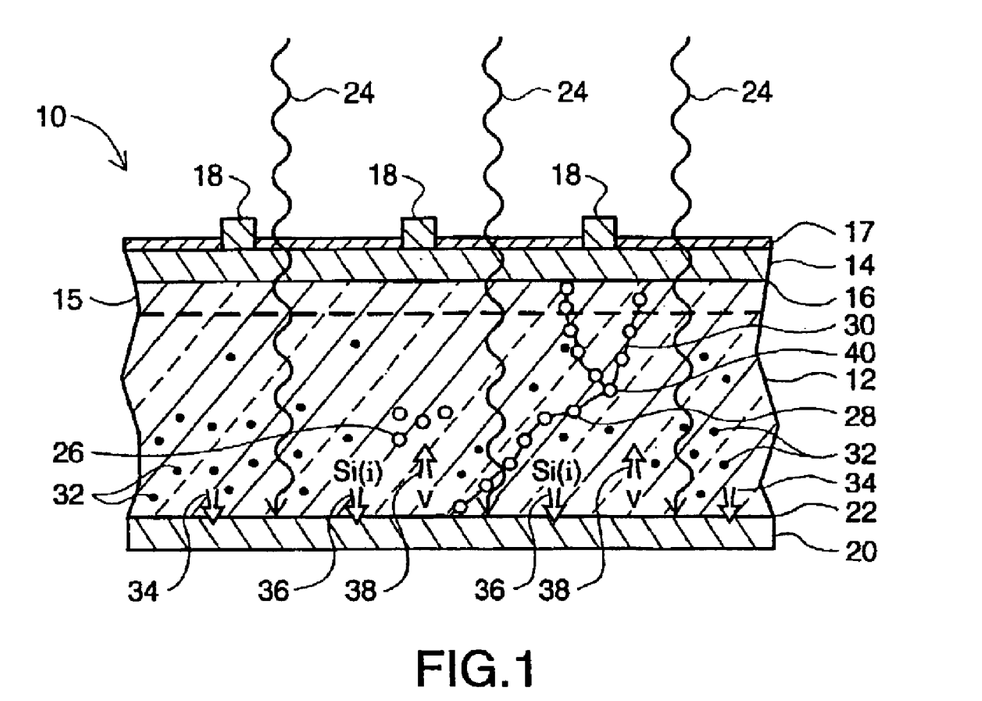
FIG. 1 is a diagrammatic view in cross-section of a silicon solar cell device having dissolved and precipitated impurities undergoing gettering and precipitate dissociation according to this invention.

Dissolving precipitate metal-silicon (MSi) impurities 26, 28 and gettering dissolved metallic impurities 32 along with those dissolved metals from impurities 26, 28 from a crystalline or multicrystalline substrate 12 of a solar cell device 10 in FIG. 1 is enhanced by optical processing with radiant energy 24. A typical solar cell device 10 may comprise a crystalline or multicrystalline substrate 12, such as, but not limited to, p-type doped silicon (Si) which acts as a base, a different material emitter layer 14, such as a different metal to form a Schottky junction 16 or a differently doped (e.g., n-type) Si to form a homo-junction 16 and a depletion zone 15, a front electrical contact 18, such as an Al grid, and a back contact 20, preferably comprising a metal that also functions as a getter, such as Al, Pd, Ni, Pt, or some other metal. An anti-reflective (A/R) coating 17 is also shown on the solar cell device 10, which is a conventional component and not part of this invention. Of course, many solar cell devices have other or additional layers, components, and/or materials, and this invention is not limited to simple solar cell 10 structure shown in FIG. 1, which is shown here only as an example with which to describe the invention. With process and device parameters designed appropriately, the front contact 18 can also be Pd, Ni, Pt, or the like, as is well-known and understood by persons skilled in the art.

The radiation 24, preferably, but not necessarily, having a spectrum rich in visible and near infrared (IR) light, is incident on the front of the cell 10, where it is transmitted from the surface area between the front contact 18, through the dissimilar emitter layer 14, and the Si substrate 12 to the interface 22 of the substrate 12 with the back contact 20. The radiation 24 greatly enhances diffusivity of many interstitial impurities 32, so that, at a given temperature, the time required for impurities 32 to diffuse from the bulk of the substrate 12 to the back contact 20 is considerably reduced as compared to thermal processing without optical enhancement or processing. For example, $D \sim 10^{-6}$ cm$^2$/sec yeilds $[[T]]\tau=(0.03)^2/10^{-6}=10$ s.

Also, a melt of the metal, e.g., Al, of contact layer 20 is created at the interface 24. A thin layer 20 of Al on a silicon wafer 12 can produce a melt at a considerably lower temperature than the melting point of Al, which is 660° C. In fact, the melting point can be even lower than the eutectic point of Si—Al alloy. The eutectic temperature of Al—Si alloy, where Al is 12.6% of the alloy, is 577° C. Although the exact mechanism(s) of such phenomenon is not yet known, the inventor believes the depression in the melting point is related to the following: (i) interface energy at the interface 22; (ii) formation of a eutectic by solid-state fusion; (iii) nano-particle like structure at the interface; and/or (iv) local temperature spike at the interface 22 produced by the light energy without a commensurate increase of the bulk temperature of the substrate 12 and the rest of the device 10. Whatever the mechanism, the melt of the Al layer 20 at the interface 22 is created by the optical processing, which, in combination with the enhanced diffusivity of impurities 32 as explained above, has the effect of gettering the impurities 32 from the substrate 12, as indicated by flow arrows 34. The device 10 temperature during this gettering process can be kept below 500° C., which, inter alia, does not degrade the reflectivity of the Al layer 20 upon resolidification of the Al, as higher temperatures would do. Therefore, efficiency of the cell 10 is enhanced, because, during operation of the cell 10, any light that reaches the back contact 20 will be reflected back into the substrate 12 for absorption and conversion to electric energy across the device junction 16.

Figure 3:
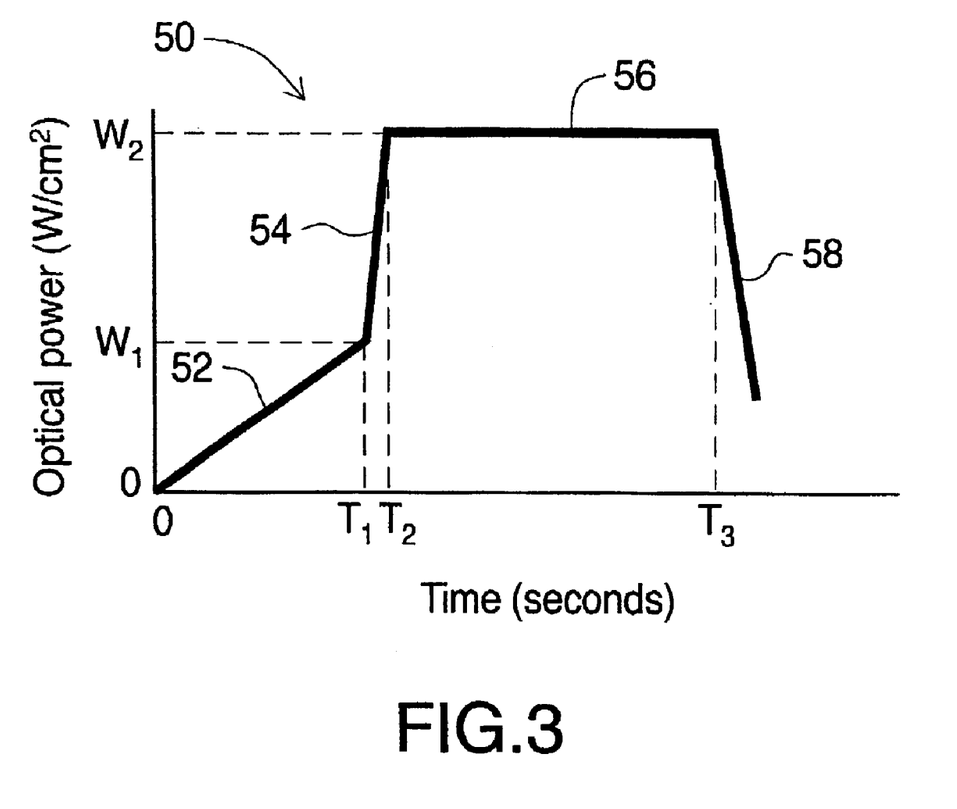
FIG. 3 is a schematic of a time versus optical power process profile for gettering dissolved impurities.

The time versus optical power profile 50 in FIG. 3 illustrates process stages for gettering dissolved impurities from the bulk Si substrate 12 by capturing them in the Al melt at the interface 22. This method for gettering dissolved impurities, as described above, takes advantage of enhancement of the diffusion coefficient of interstitial impurities upon illumination with intense light—particularly fast diffusing transition metal impurities, which are also lifetime killer impurities. The first stage 52 illustrates a slow warm up stage by ramping up optical power slowly from 0 to time $T_1$ in order to minimize chances of breaking the substrate 12 due to localized thermally induced stresses. Then, in the second stage 54 from time $T_1$ to time $T_2$, the optical power is increased more rapidly to the level $W_2$, where it is held during third stage 56 from time $T_2$ to time $T_3$ while the dissolved impurities 32 (FIG. 1) diffuse to the melted Al at interface 22, where they are dissolved by the Al layer 20. In the fourth stage 58, after time $T_3$, the optical power is ramped down and shut off, so the Al melt cools and solidifies, thereby capturing the impurities in solidified Al layer 20.

The specific time intervals and optical power levels in the profile will be selected based on experience and a number of parameters, such as thickness of the substrate 12, process temperatures desired, specific impurities to be gettered, and efficiency desired. For illustration only, an example process cycle in which a melt at the Si—Al interface 22 is produced at a temperature of less than 550° C., $W_1$ may be in a range of about 3–4 watts/cm$^2$ and $W_2$ may be in a range of about 4–6 watts/cm$^2$, while $T_1$ may be approximately 10–40 seconds, e.g., about 20 seconds, the interval $T_1$–$T_2$ can be about instantaneous to several seconds or more, the duration of the time period $T_2$–$T_3$ for stage 56 may be in a range of about 300–600 seconds, and the ramp down stage 58 can be almost instantaneous to several seconds or more.

Another important feature of the optical processing of this invention is enhanced dissolution of impurity precipitates 26, 28 in the substrate 12, 50 they can diffuse or migrate through the Si substrate to the Al for trapping such impurities. There is now considerable evidence that Al alloying by optical processing can inject vacancies into the bulk of the silicon, such as the silicon substrate 12. Such point defect dynamics taking place at the Si—Al interface 22 during excitation by infrared-rich light 24 are illustrated diagrammatically in FIG. 1. Si interstitials—"Si(i)"—are injected into the Al 20, as illustrated by flow arrows 36, while vacancies—"V"—are injected into the bulk of the silicon wafer or substrate 12, as indicated by flow arrows 38. These vacancies V have very high diffusivity resulting in a rapid increase in the vacancy V concentration in the bulk of the Si substrate 12 at very low temperatures, e.g., in the range of about 400–500° C. The presence of the vacancies V lowers the energy required for dissociation of precipitates 26, 28, which usually comprise FeSi, CuSi, or some other metal-silicide (MSi) and to make the "pinned" defects in the precipitates 26, 28 mobile. Thus, by providing vacancies V in the vicinity of defect clusters and imparting sufficient thermal energy, the injected point defects or vacancies V can induce annihilation of dislocation networks and dissociation of precipitates 26, 28. The metal M, such as Fe, Cu, or the like, from the dissociated precipitates 26, 28, can diffuse into the bulk silicon substrate 12 and migrate to the Al along with the other metal impurities 32, as indicated by flow arrows 34. Upon ending the irradiation 24, the interface 22 will cool, and the Al will solidify, trapping the gettered metal impurities in the Al layer 20. The annihilation of dissociation networks can decrease recombination sites, thus increases solar energy conversion efficiency of the cell 10. Annihilation of such recombination sites by dissociation of precipitate impurities, for example, at a dislocation node 40, can also prevent "shunts" that can severely degrade voltage-related parameters of device 10.

Figure 2:
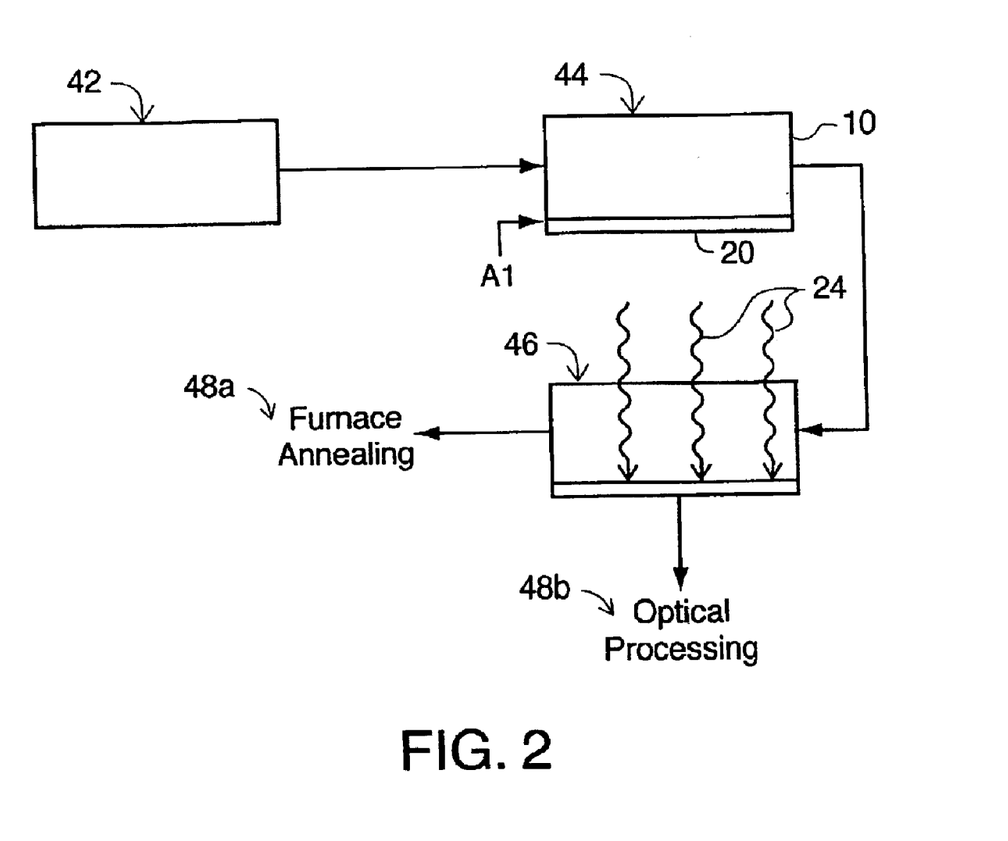
FIG. 2 is a schematic diagram illustrating last steps in a semiconductor fabrication process that includes optical Al gettering according to this invention with two options—one for finishing with conventional thermal annealing in a furnace and another for finishing with optical processing.

The impurity dissolution described above can be combined with either conventional gettering by furnace annealing or Al gettering by optical processing, as illustrated in FIG. 2. Step 42 indicates forming the solar cell device 10 with everything but the back Al layer 20. Step 44 shows deposition of the Al layer, such as contact layer 20, onto the device 10. Step 46 shows the irradiation 24, for example with 4–6 watts/cm² of IR-rich light, to inject vacancies V in order to then accomplish the impurity dissociation or dissolution, as described above in the preceding and following paragraphs. Step 48a indicates the option of then proceeding with thermal annealing in a furnace in a conventional manner to getter the impurities with the Al, whereas step 48b indicates the option of continuing the optical processing, e.g., with a spectrum rich in visible and near IR radiation, to getter the impurities with the Al. Such optical processing or irradiation can be used in place of the furnace and can raise the device 10 temperature to accomplish Al gettering in short duration, such as about 5 to 20 minutes, and preferably less than 10 minutes. In either option, the gettering temperatures can be low enough, such as less than 500° C., so that the gettering can be done at the end of the fabrication process, e.g., the last process step, without degrading the Al layer 20, especially its reflectivity.

Figure 4:
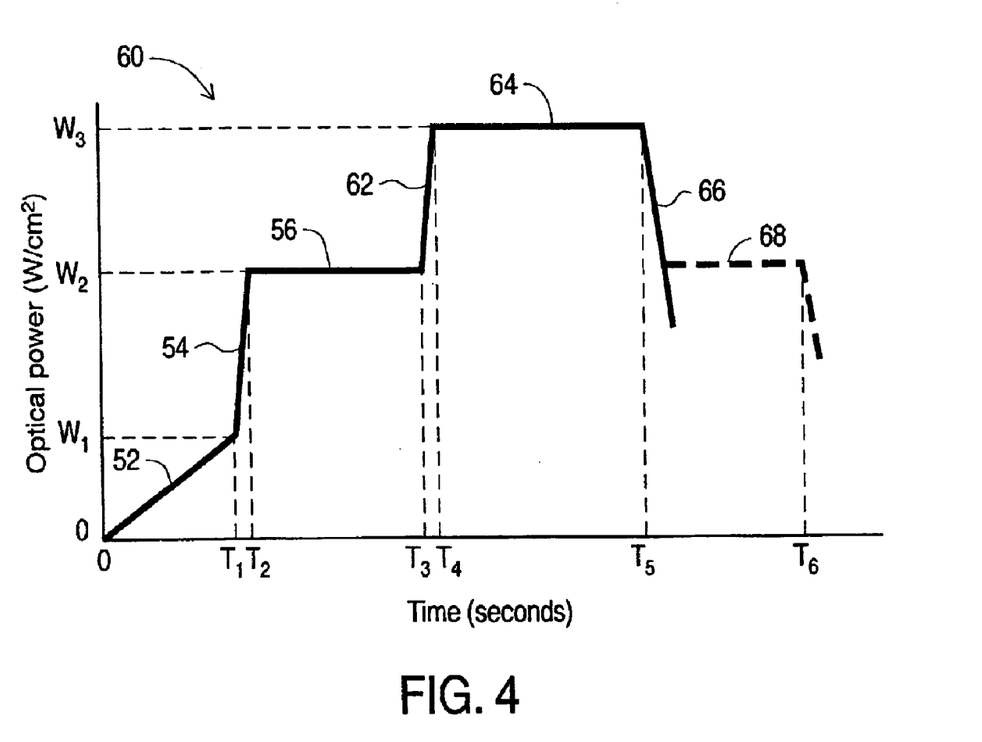
FIG. 4 is a schematic of a time versus optical power process profile for dissolution and gettering of precipitated impurities.

The time versus optical power profile 60 in FIG. 4 illustrates process stages for not only gettering already dissolved and diffuse impurities 32 (FIG. 1) from the Si substrate 12, but also for dissociating and dissolving, then gettering precipitated impurities 26, 28, 40 (FIG. 1), as described above. The first three phases 52, 54, 56 of this process can be much like the same three phases 52, 54, 56 described above for the FIG. 3 profile and process, including much the same example optical power levels and ranges for $W_1$ and $W_2$ and much the same example time intervals and durations. However, in addition to accomplishing migration of already dissolved impurities 32 (FIG. 1) to the Al melt at the Si—Al interface 22 (FIG. 1) in the third phase 56, the optical power level $W_2$ also causes interstitial Si(i) insertion into the Al layer 20 and creation of the vacancies V, which are inserted into the Si substrate 12, as illustrated by the flow arrows 36, 38 in FIG. 1. The time duration $T_2$–$T_3$ of this phase 56 (FIG. 4) at optical power level $W_2$ is also sufficient to saturate the Si substrate 12 (FIG. 1) with vacancy insertions V. However, a higher temperature, such as in a range of about 700–900° C., is needed for activation of the vacancies V in the silicon substrate 12, so they can be effective at enhancing dissociation and dissolution of the precipitate impurities 26, 28, 40. Therefore, the optical power is ramped up again in a fourth phase 62 to a level $W_3$, where it is held during a fifth stage 64 to achieve the required vacancy activation, precipitate dissociation and dissolution into the Si substrate 12, and diffusion and migration to the melted Al at interface 22. When these functions have been accomplished to a desired extent, the optical power can be ramped down in a sixth phase 66 and shut off to allow the Al melt to solidify and capture the impurities in the Al layer 20. Even though the temperature is higher (700–900° C.) in this stage 64, it is believed the Al contact 20 will still be of high quality reflectance due to the shorter time that the substrate 12 is held at such high temperature in this process.

Of course, many variations of time and optical power are feasible within the principles of this invention. For example, it may be desirable to hold the optical power at some intermediate level, such as at $W_2$ or some other suitable level, for a period of time after the vacancy V activation stage 64, to ensure that most, if not virtually all, of the dissolved impurities from the dissociated precipitates 26, 28, 40 migrate to and are captured by the Al layer 20 before the optical power is turned off altogether. Such an optional stage 68 is shown in broken lines in FIG. 4 extending to a time $T_6$.

As mentioned above, the optical power levels $W_1$ and $W_2$ as well as the time period durations for the FIG. 4 embodiment can be the same or similar to those values described above for the FIG. 3 embodiment. The temperature ramp up in stage 62 can be almost instantaneous or over several seconds or more. The time duration for the optical power level $W_3$ for the vacancy activation stage 64 will depend to a large extent on the temperature, therefore, optical power used and sizes of the precipitates 26, 28, 40. Thus, the size distribution of the precipitates 26, 28, 40 in the Si substrate 12 may have a substantial bearing on the process parameters needed, especially for stage 64. To achieve the 700 to 900° C. temperatures needed for vacancy V activation, as discussed above, the optical power level $W_3$ may be, for example, in a range of about 6–8 watts/cm². The time duration may be, for example, in a range of about 800–2000 seconds. The ramp down stage 66 can be instantaneous to a few seconds or more.

Figure 5:
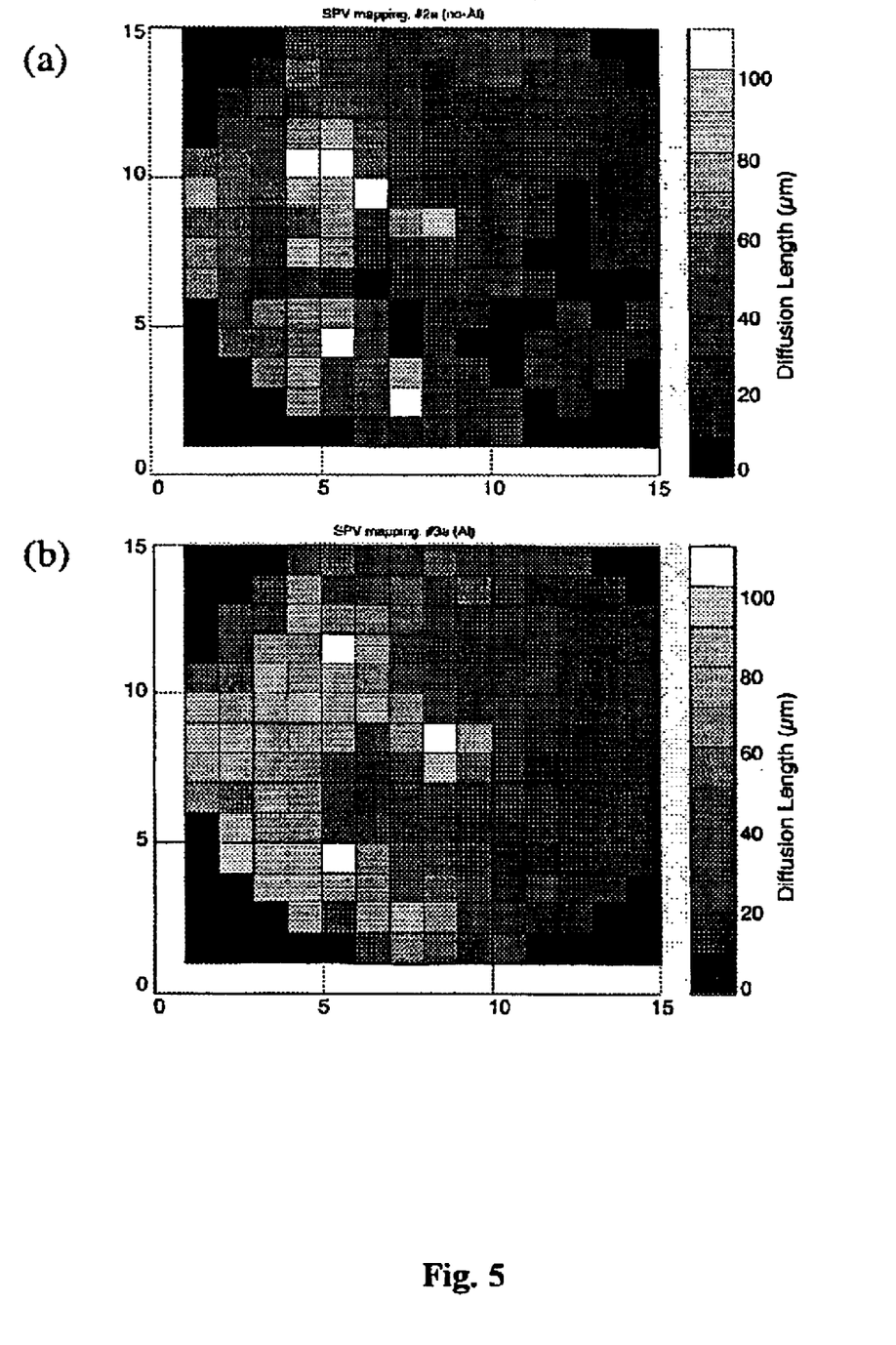

An example of the results of applying the precipitate dissociation and dissolution as well as Al gettering stages of this invention to a multicrystalline silicon (mc—Si) wafer can be seen in FIG. 5 by the increase in minority carrier length distribution before (a) and after (b) gettering using point defect injection. With few exceptions, the minority carrier diffusion length in each pixel or segmented region shows increase after the gettering and point defect injection process of this invention. In a few pixels or regions, such as the one at column four from the left and row five from the top in FIG. 5, the minority carrier diffusion length may have decreased. Such local discrepancies may be attributable to dissociation of a precipitate at that location, with the impurity then dissolving and diffusing into the Si material, but insufficient time after such dissociation for the impurities to diffuse or migrate to the Al melt getter. It is possible that some additional time for such diffusion and gettering, as perhaps by the optional stage 68 in FIG. 4, might have resulted in a showing of increased minority carrier diffusion length in that pixel or region, too.

It should be pointed out that there are other processes that, in principle, can accomplish similar results by injecting point defects. These include thermal heating alone, use of high temperature phosphorus diffusion, and perhaps boron diffusion. However, they require high temperatures in the range of 1000–1200° C. Processing at these temperatures is expensive, system cleanliness is a major concern to prevent in-diffusion of impurities, and unwanted reactions between defects and impurities can occur. The injection of point defects into Si from a Si—M (Al) interface by Optical Processing, as described above, reduces the process temperatures as compared to producing similar effects by thermal processing alone. Clearly, generation of point defects from a Si—M interface can be applied only where use of metal is either warranted by other process considerations. This is clearly the case for Al gettering, and contact formation. There are other metals that can have characteristics similar to that of Al and can be used in the gettering process. These include Pd, Ni, and Pt.

Furthermore, since numerous modifications and changes will readily occur to those skilled in the art, it is not desired to limit the invention to the exact construction and process shown and described above. Accordingly, resort may be made to all suitable modifications and equivalents that fall within the scope of the invention as defined by the claims which follow. The words "comprise," "comprises," "comprising," "include," "including," and "includes" when used in this specification are intended to specify the presence of stated features, integers, components, or steps, but they do not preclude the presence or addition of one or more other features, integers, components, steps, or groups thereof.

What is claimed is:

1. A method of dissociation, dissolution, and gettering of precipitate impurities in a silicon wafer that has a front face and a back face substantially opposite each other and a layer of gettering metal selected from a group consisting of Al, Pd, Ni, or Pt on the back face which forms a silicon/metal interface, comprising:

propagating light energy through the silicon wafer from the front face to the silicon/metal interface with sufficient optical power density to melt the gettering metal at the silicon/metal interface, while keeping the temperature of the silicon wafer less than 550° C. for a sufficient first period of time to cause interstitial silicon Si(i) insertion into the gettering metal to thereby create and insert enough vacancies V in the silicon wafer to saturate& the silicon wafer with vacancies V;

increasing the optical power density level for a sufficient second time period to increase the silicon wafer temperature to at least 700° C., but not more than 900° C., to activate the vacancies V in the silicon wafer to induce dissociation and dissolution of the precipitate impurities in the silicon and to achieve the dissociation and dissolution of the precipitate impurities;

allowing the dissolved impurities resulting from such dissociation of the precipitate impurities to diffuse and migrate to the melted gettering metal; and ramping down the optical power density and cooling the silicon wafer enough to solidify the gettering metal and capture the impurities that have diffused and migrated to the gettering metal.

2. The method of claim 1, wherein said first period of time is in a range of 5–20 minutes.

3. The method of claim 1, wherein the silicon wafer temperature during the first period of time is in a range of 400–500° C.

4. The method of claim 1, wherein said increasing the optical power density for a sufficient second time period to activate the vacancies V in the silicon wafer to enhance dissociation and dissolution of the precipitate impurities in the silicon wafer includes increasing said optical power density for a sufficient second period of time to maintain the silicon wafer in a temperature range of 700–900° C. for 800–2000 seconds.

5. The method of claim 1, including lowering the optical power density after the second time period to maintain the silicon wafer in a temperature range lower than 550° C., but with a melt of the metal at the silicon/metal interface, for a third period of time to allow gettering of the impurities resulting from the dissociation and dissolution of the precipitate impurities in the second time period before said cooling to solidify the gettering metal.

6. The method of claim 1, wherein said light energy in the first time period includes infrared light energy.

7. The method of claim 1, wherein said light energy in said second time period includes visible and near infrared light energy.

8. A method of dissociating, dissolving, and gettering precipitate impurities in a silicon wafer that has a front face and a back face and a layer of gettering metal comprising Al on the back face, which forms a Si—Al interface, comprising:

propagating light energy through the silicon wafer from the front face to the Si—Al interface with sufficient optical power density to melt the gettering material at the Si—Al interface while keeping the temperature of the silicon wafer less than 550° C. for a sufficient first period of time to cause interstitial silicon Si(i): insertion into the Al to thereby create and insert enough vacancies V in the silicon wafer to saturate the silicon wafer with vacancies V;

increasing the optical power density level for a sufficient second time period to not only increase the silicon wafer temperature to a range of 700–900° C., but also to activates the vacancies V in the silicon wafer to induce dissociation of the precipitate impurities so that they can dissolve into the silicon wafer;

allowing the dissolved impurities resulting from the dissociation of the precipitate impurities to diffuse and migrate through the silicon wafer to the Al; and ramping down the optical power density and allowing the silicon wafer and Al to cool enough to solidify the Al and thereby capture the impurities that have diffused and migrated to the Al.

9. The method of claim 8, wherein the first time period is in a range of 5–20 minutes.

10. The method of claim 8, wherein the silicon wafer temperature during the first time period is in a range of 400–500° C.

11. The method of claim 8, wherein the second time period is in a range of 800–2,000 seconds.

12. The method of claim 8, including lowering the optical power density after the second time period to maintain the silicon wafer in a temperature lower than 550° C., but still high enough to maintain a melt of the Al at the Si—Al interface, for a third period of time to facilitate migration and gettering of the dissolved impurities, which resulted from the dissociation of the precipitate impurities during the second time period, before the cooling of the silicon wafer and Al to solidify the Al.

13. The method of claim 8, wherein said light energy in the first time period comprises infrared light energy.

14. The method of claim 13, wherein said light energy in the second time period comprises near-infrared and visible light energy.

* * * * *